United States Patent
Bindrup et al.

(10) Patent No.: US 8,637,985 B2
(45) Date of Patent: Jan. 28, 2014

(54) ANTI-TAMPER WRAPPER INTERCONNECT METHOD AND A DEVICE

(75) Inventors: Randy Bindrup, Trabucco Canyon, CA (US); James Yamaguchi, Laguna Nigel, CA (US); W. Eric Boyd, Long Beach, CA (US)

(73) Assignee: ISC8 Inc., Costa Mesa, CA (US)

( * ) Notice: Subject to any disclaimer, the term of this patent is extended or adjusted under 35 U.S.C. 154(b) by 0 days.

(21) Appl. No.: 13/370,381

(22) Filed: Feb. 10, 2012

(65) Prior Publication Data

US 2012/0205801 A1 Aug. 16, 2012

Related U.S. Application Data

(60) Provisional application No. 61/443,482, filed on Feb. 16, 2011.

(51) Int. Cl.
*H01L 23/488* (2006.01)
(52) U.S. Cl.
USPC .......................................... 257/738; 257/723

(58) Field of Classification Search
USPC .................................................. 257/738, 723
See application file for complete search history.

(56) References Cited

U.S. PATENT DOCUMENTS

| | | | |
|---|---|---|---|
| 2008/0251906 A1* | 10/2008 | Eaton et al. | 257/686 |
| 2009/0065943 A1* | 3/2009 | Rothman et al. | 257/772 |
| 2010/0264521 A1* | 10/2010 | Wood et al. | 257/621 |
| 2012/0049334 A1* | 3/2012 | Pagaila et al. | 257/666 |

* cited by examiner

*Primary Examiner* — Howard Weiss
*Assistant Examiner* — Tifney Skyles
(74) *Attorney, Agent, or Firm* — W. Eric Boyd, Esq.

(57) ABSTRACT

A method for electrically coupling an anti-tamper mesh to an electronic module or device using wire bonding equipment and a device made from the method. Stud bumps or free air ball bonds are electrically coupled to conductive mesh pads of an anti-tamper mesh. Respective module pads have a conductive epoxy disposed thereon for the receiving of the stud bumps or free air ball bonds, each of which are aligned and bonded together to electrically couple the anti-tamper mesh to predetermined module pads.

5 Claims, 3 Drawing Sheets

ANTI-TAMPER WRAPPER INTERCONNECT METHOD AND A DEVICE

CROSS-REFERENCE TO RELATED APPLICATIONS

This application claims the benefit of U.S. Provisional Patent Application No. 61/443,482, filed on Feb. 16, 2011 entitled "Anti-Tamper Wrapper Interconnect Method and Device" pursuant to 35 USC 119, which application is incorporated fully herein by reference.

STATEMENT REGARDING FEDERALLY SPONSORED RESEARCH AND DEVELOPMENT

N/A

BACKGROUND OF THE INVENTION

1. Field of the Invention

The invention generally relates to the field of anti-tamper fabrication and assembly approaches for electronic circuits and microelectronic packages.

More specifically, the invention relates to an electrical coupling method and device for use with electronic circuits or modules that are enclosed in an anti-tamper wrapper or mesh for the sensing of an attempt to tamper with the circuit or module within the wrapper.

2. Description of the Related Art

It is a known concern of military and commercial entities that reverse engineering and evaluation of an electronic circuit can occur when the electronic circuit (e.g., a microelectronic circuit) falls into enemy hands or into the possession of a business competitor. The U.S. Government has expressly noted such a concern in a directive entitled, "DoD Directive 5200.39, "Research and Technology Protection within the Department of Defense," issued in March 2002.

Military opponents or commercial competitors can gain an advantage by learning the operation and vulnerability of a circuit by electronic probing or by physically examining the circuit such as using X-ray or by mechanically or chemically removing circuit or package structures to understand and view the circuit in order to duplicate or develop methods of defeating it.

In view of the above, having means in place to make the reverse engineering of a protected circuit difficult or impossible without complex test equipment is needed. Such protection is needed to minimize the risk an adversary can learn key features and functions of a protected circuit and develop means to disable or imitate the device.

One such anti-tamper method is described in U.S. Pat. No. 7,947,911, issued May 24, 2011 and entitled, "Anti-Tamper Mesh" which describes a method of forming an anti-tamper mesh on an electronic device. The method described includes forming at least one terminal on the electronic device and forming a conductive mesh on at least one surface of the electronic device, wherein the conductive mesh is in electrical contact with the terminal, and wherein the terminal facilitates electrical conduction between the conductive mesh and an electrical detection circuit wherein tampering with the conductive mesh is detected by the circuit.

In a typical anti-tamper circuit, i.e., a protected circuit, upon detection of a tamper event, a predetermined tamper response is generated, i.e., a protected circuit will take some action when unauthorized activities are detected. Any number of events can be used to sense and trigger a predetermined circuit response. Examples of active triggering events may include: voltage, photon detection, acceleration, strain, thermal, chemical attack, and proximity or tamper-respondent enclosures. A tamper-respondent package is used to detect unauthorized probing by proximity detection or by an external activity mutilating an active circuit, exterior to what is being protected. The response of an active anti-tamper circuit upon triggering is also widely variable. For example, data zeroization may be employed in which critical memory cells or an entire die can be erased. Similarly, a response can trigger overwriting of some or all of a memory die. Another detection response is to physically obliterate a critical circuit element or elements such as by use of a FET switch or fusible link embedded in the circuit.

Anti-tamper meshes are available for wrapping or enclosing a circuit package or module wherein the mesh structure is a sheet comprising a plurality of electrically conductive metal traces, the breaking or shorting of which are used to generate a tamper response. The meshes are provided with a grid or matrix of exposed conductive mesh pads of a predetermined pitch and spacing for electrical coupling to the device to be protected where the device has a matching set of conductive device or module pads that have substantially the same pitch and spacing as the mesh pads. Because the pitch and spacing of the mesh pads is small and the tolerances and precision needed to connect the mesh pads to the device or modules pads is high, the electrical coupling of the mesh to the protected device is difficult.

What is needed is a low-cost, reliable method for the interconnection of the mesh conductive pads to the pads of the protected device.

BRIEF SUMMARY OF THE INVENTION

A method for electrically coupling an anti-tamper mesh to an electronic module or device is provided using wire bonding equipment. Stud bumps or free air ball bonds are electrically coupled to the conductive mesh pads of the anti-tamper mesh. Respective conductive module pads have a conductive epoxy disposed thereon for the receiving of the stud bumps or free air ball bonds which are aligned and bonded together to electrically couple the anti-tamper mesh to predetermined module pads. A device made from the method is also disclosed.

In a first aspect of the invention, a method for electrically coupling a mesh structure to a module is disclosed comprising the steps of defining a stud bump on a conductive mesh pad in an anti-tamper mesh, defining a conductive epoxy on a conductive module pad, aligning the stud bump with the conductive epoxy and bonding the stud bump to the conductive epoxy to electrically couple the conductive mesh pad to the conductive module pad.

In a second aspect of the invention, a method for electrically coupling a mesh structure to a module is disclosed comprising the steps of electrically connecting a tail of a free air ball bond on a conductive mesh pad in an anti-tamper mesh, defining a conductive epoxy on a conductive module pad, aligning the free air ball bond with the conductive epoxy and bonding the free air ball bond to the conductive epoxy to electrically couple the conductive mesh pad to the conductive module pad.

In a third aspect of the invention, an electronic device is disclosed that is fabricated from a method comprising the steps of providing an electronic device having a conductive module pad on a surface thereof, defining a stud bump on a conductive mesh pad in an anti-tamper mesh, defining a conductive epoxy on a conductive module pad, aligning the stud bump with the conductive epoxy and bonding the stud bump to the conductive epoxy to electrically couple the conductive mesh pad to the conductive module pad.

In a fourth aspect of the invention, a change in electrical continuity of a trace (i.e., an electrical open or short) in the anti-tamper mesh of the device generates a predetermined tamper response.

In a fifth aspect of the invention, the predetermined tamper response is a zeroizion of the contents of a memory.

In a sixth aspect of the invention, the predetermined tamper response is an opening or closing of a FET switch.

In a seventh aspect of the invention, an electronic device is disclosed that is fabricated from a method comprising the steps of providing an electronic device having a conductive module pad on the surface thereof, electrically connecting a tail of a free air ball bond on a conductive mesh pad in an anti-tamper mesh, defining a conductive epoxy on a conductive module pad, aligning the free air ball bond with the conductive epoxy and bonding the free air ball bond to the conductive epoxy to electrically couple the conductive mesh pad to the conductive module pad.

While the claimed apparatus and method herein has or will be described for the sake of grammatical fluidity with functional explanations, it is to be understood that the claims, unless expressly formulated under 35 USC 112, are not to be construed as necessarily limited in any way by the construction of "means" or "steps" limitations, but are to be accorded the full scope of the meaning and equivalents of the definition provided by the claims under the judicial doctrine of equivalents, and in the case where the claims are expressly formulated under 35 USC 112, are to be accorded full statutory equivalents under 35 USC 112.

The invention and its various embodiments can now be better understood by turning to the following detailed description of the preferred embodiments which are presented as illustrated examples of the invention defined in the claims. It is expressly understood that the invention as defined by the claims may be broader than the illustrated embodiments described below.

DETAILED DESCRIPTION OF THE INVENTION

Certain electronic circuits and modules integrate an anti-tamper protective wrapper around a stacked board structure to trigger a predetermined tamper event such as a zeroization of a memory or an overvoltage to destroy the contents of circuit to prevent reverse engineering by an unauthorized person.

The need for a method to electrically connect an anti-tamper wrapper to an active board structure is an integral part of a total anti-tamper package concept. Prior art interconnection methods for the wrapper-to-board structure include the use of a cable assembly.

The following discloses alternative methods for interconnection of anti-tamper wrappers to a protected device or module that are sensitive to tampering by an unauthorized individual. The method of the invention is particularly well-suited toward stacked devices and three-dimensional electronic modules.

Turning now to the figures wherein like numerals define like elements among the several views, a method for electrically coupling an anti-tamper wrapper or mesh to a component or housing or circuit carrying element is disclosed along with a device made from the method.

Figure 1:
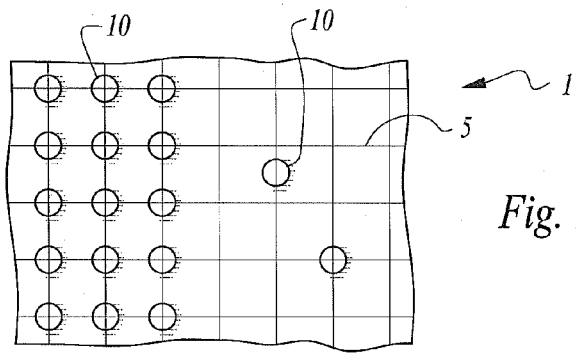
FIG. 1 depicts an anti-tamper mesh having a plurality of conductive metal traces and exposed conductive mesh pads.

With respect to FIG. 1, an anti-tamper mesh 1 having a plurality of conductive metal traces 5 embedded within an insulating material such as a non-conductive polymer sheet material is depicted and having one or more exposed conductive mesh pads 10 for electrical coupling to a protected device or module. Conductive traces 5 in the exemplar anti-tamper mesh 1 are configured such that continuity there through is monitored or sensed by suitable electronic circuitry and that if an open or short from a tamper attempt in one or more of the conductive metal traces 5 is detected, a predetermined tamper response is generated. by a monitoring circuit in the protected device.

The protected device may comprise secure internal processing means such as a Maxim DS5250 high speed secure microprocessor element, or a MAXQ or DS3640 Maxim device. The Maxim DS3655 Secure Supervisor from Maxim Integrated Products, Inc. is well-suited for use as an element of a protected module and provides tamper-detection comparator inputs that interface with and provide continuous, low-power monitoring of resistive anti-tamper resistive meshes, external sensors, and digital interlocks. The Maxim DS3655 device provides circuitry that monitors primary power and, in the event of failure, an external or embedded storage capacitor or battery power source is switched in to keep the device and external circuitry active. The DS3655 also monitors battery voltage and initiates a tamper response such as erasure of the contents of a memory element when the battery voltage becomes abnormal or there is a predetermined temperature limit or rate of change that is exceeded.

When anti-tamper circuitry such as the Maxim devices above sense a breach in the anti-tamper mesh, a tamper response is generated such as zeroizion of the contents of a memory or the opening of a fuse element such as a FET switch.

For example, using FET switches in a protected module that are embedded into the memory package provides the ability to disable external interfaces and wipe internal encryption keys in a tamper event.

A purpose of the PET switch operation is to provide internal nano-fuses that control PET switches and basically serve to isolate the external interface (e.g., such that during a long zeroization procedure) or to isolate a memory contents after a tamper event so there is no way to access the contents of device or impact its internal performance by attempting to short data lines or hack into the module via an electrical interface. In other words, the internal elements of the anti-tamper module will still operate on power-up to zeroizion or perform a tamper event penalty response but external electrical access is eliminated by the blowing of the FET switches or fusible link.

Exposed conductive mesh pads 10 are provided with a predetermined pitch or orientation on the anti-tamper mesh inner surface 15.

Figure 2:
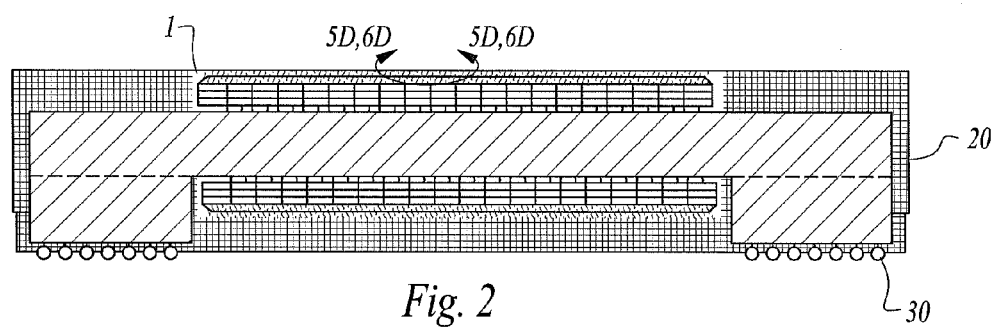
FIG. 2 is a cross-section of a protected electronic module encased by and electrically coupled to the anti-tamper mesh.
Figure 5A:
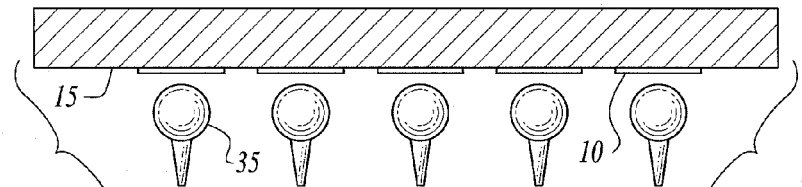
FIGS. 5A-5D depict process steps for the electrical coupling of an anti-tamper mesh to a module using a plurality of stud bump structures.
Figure 5B:
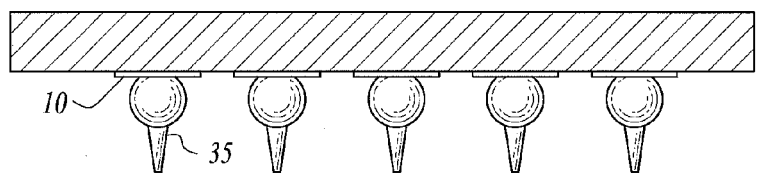
Figure 5C:
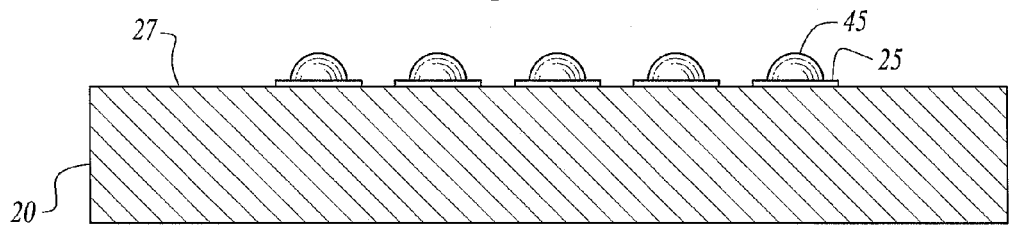
Figure 5D:
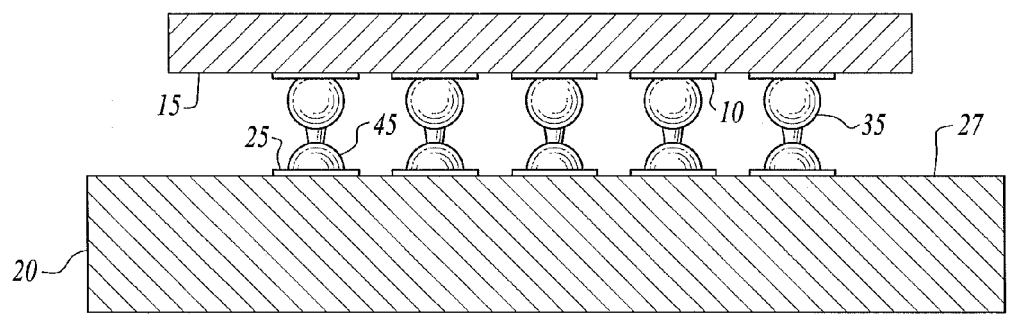
Figure 6A:
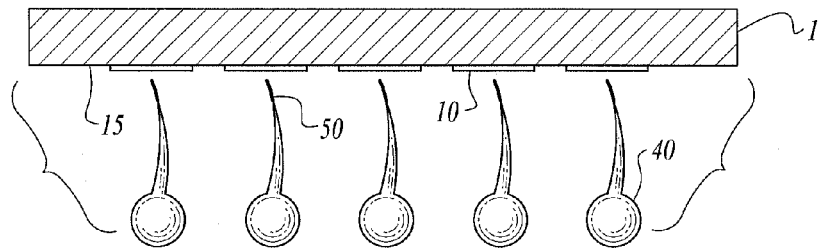
FIGS. 6A-6D depict process steps for the electrical coupling of an anti-tamper mesh to a module using a plurality of free air ball structures.
Figure 6B:
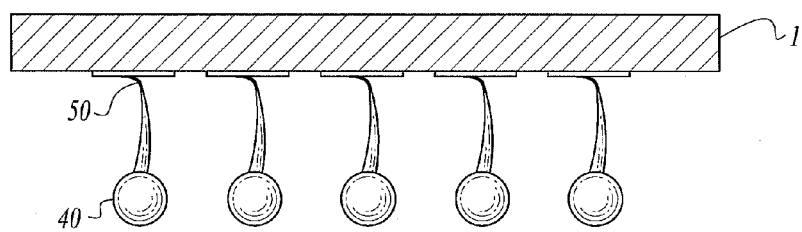
Figure 6C:
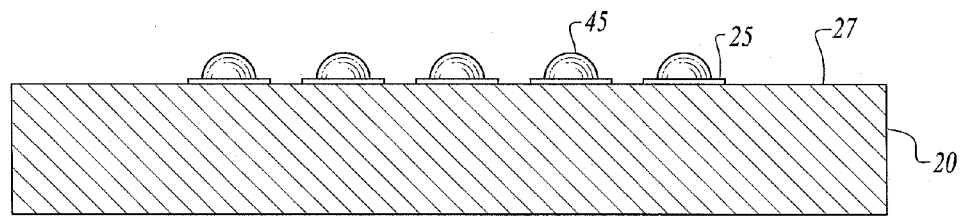
Figure 6D:
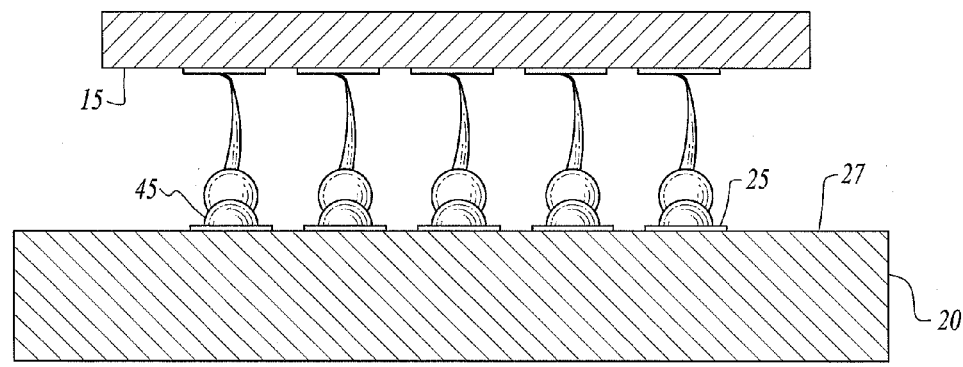

FIGS. 2, 5D and 6D show different views of an exemplar structure of a three-dimensional module 20 protected and enclosed by anti-tamper mesh 1 having a plurality of conductive mesh pads 10 disposed thereon.

With the ability to create three-dimensional modules 20 and with the ability to create conductive pad structures on a surface of a device or module or to fabricate a module with a top interface board or cap chip, a wire bond-like interconnect structure is utilized in the invention to interconnect mesh 1 to a protected device such as module 20.

In a preferred embodiment of the method, conductive module pads 25 on a surface 27 of module 20 are interconnected to the bottom of module 20 through the side metal bussing. If required, these connections are interconnected to the active layer structures within the stack, if necessary, through the layer interconnect structure (using, for instance, metalized T-connect structures such as are disclosed in various patents issued to ISC8 Inc. assignee herein, formerly Irvine Sensors Corporation). This permits electrical communication with the circuitry in the stack if necessary. Ultimately the module's interconnections are routed out through the bottom interface board of the stack by a BGA interface 30 to the main module board and subsequently assembled to a motherboard.

Figure 3:
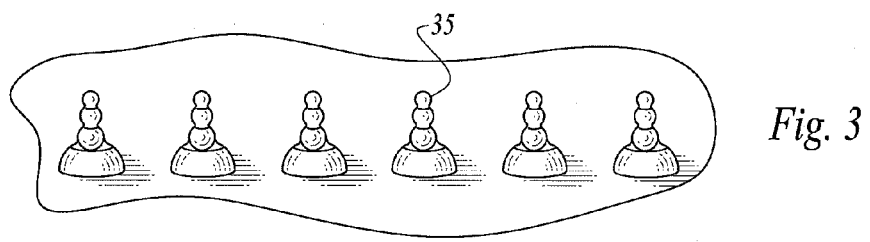
FIG. 3 depicts a plurality of stacked stud bumps formed by a wire bond machine
Figure 4:
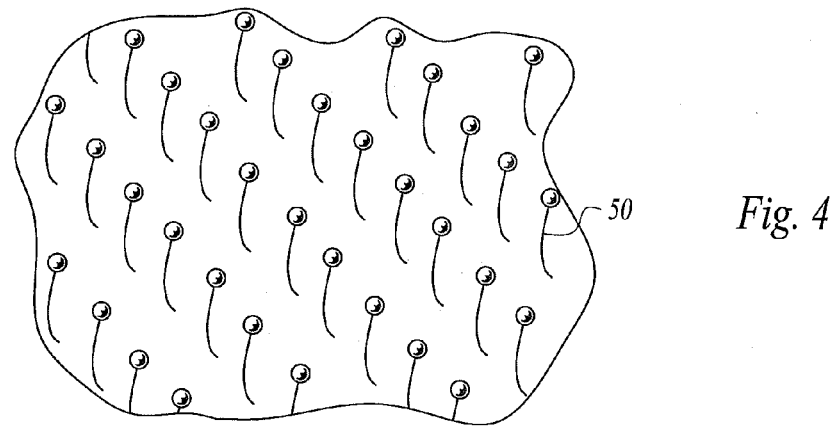
FIG. 4 depicts a plurality of free air ball structures formed by a wire bond machine.

In two of the preferred embodiments of the methods of the invention for creating wire bond anti-tamper mesh interconnects, one or more stacked sets of "stud bumps" as seen best in FIG. 3 or free air ball (also referred to as 'Cherry Pit" bond) structures as best seen in FIG. 4 are defined on and are electrically coupled to mesh pads 10.

With respect to the metal stud bump embodiment, a preferred assembly sequence is as generally shown in FIGS. 5A-5D. In a preferred embodiment of the metal stud bump method of the invention and as seen in FIGS. 5A and 5B, one or more sets of stacked metal stud bumps 35 are defined at and electrically coupled to predetermined conductive mesh pads 10 using a wire bond machine.

An electrically conductive epoxy 45 is applied to the respective conductive module pads to be electrically coupled to the stud bumps.

With the stud bumps 35 attached to mesh 1, stud bumps 35 of the mesh structure are aligned with the conductive module pads 25 and are embedded in the conductive epoxy 45 thereon. The conductive epoxy 45 is allowed to cure whereby the respective stud bumps 35 function to electrically couple the conductive mesh pads 10 and the conductive module pads 25.

In an alternative embodiment of the method of the invention of FIGS. 6A-6D, the free air ball coupling method is disclosed.

As seen in FIG. 6A, the tail 50 of free air ball 40 is defined on and electrically coupled to predetermined conductive mesh pads 10 on mesh 1 using a wire bond machine.

An electrically conductive epoxy is applied to the respective conductive module pads to be electrically coupled to the free air ball 40.

With the tails 50 attached mesh 1, the free air balls on the mesh structure are aligned with the conductive module pads and are embedded in the conductive epoxy thereon. The conductive epoxy is allowed to cure whereby the respective free air ball structures function to electrically couple the conductive mesh pads and the conductive module pads.

Either of these interconnect structures provides the necessary electrical connection between the anti-tamper wrapper and the module. Once the bond is made between the wire bond connections to the surface of the module, there is a degree of compliancy to prevent the wire bond from breaking due to expansion/contraction stresses within the module. If these bonds are physically stressed (e.g. a stretching or shearing stress), such motion would cause the wire bond to break, thus creating an open in the anti-tamper circuit.

These interconnection concepts permit a positive electrical interconnection that when physically stressed in the event an unauthorized individual attempts to tamper with the device, the circuitry will be zeroized, destroyed or a predetermined anti-tamper event will be initiated damaged such that the electrical circuit is rendered useless or altered such that the circuitry cannot readily be reverse engineered.

Many alterations and modifications may be made by those having ordinary skill in the art without departing from the spirit and scope of the invention. Therefore, it must be understood that the illustrated embodiment has been set forth only for the purposes of example and that it should not be taken as limiting the invention as defined by the following claims. For example, notwithstanding the fact that the elements of a claim are set forth below in a certain combination, it must be expressly understood that the invention includes other combinations of fewer, more or different elements, which are disclosed in above even when not initially claimed in such combinations.

The words used in this specification to describe the invention and its various embodiments are to be understood not only in the sense of their commonly defined meanings, but to include by special definition in this specification structure, material or acts beyond the scope of the commonly defined meanings. Thus if an element can be understood in the context of this specification as including more than one meaning, then its use in a claim must be understood as being generic to all possible meanings supported by the specification and by the word itself.

The definitions of the words or elements of the following claims are, therefore, defined in this specification to include not only the combination of elements which are literally set forth, but all equivalent structure, material or acts for performing substantially the same function in substantially the same way to obtain substantially the same result. In this sense it is therefore contemplated that an equivalent substitution of two or more elements may be made for any one of the elements in the claims below or that a single element may be substituted for two or more elements in a claim. Although elements may be described above as acting in certain combinations and even initially claimed as such, it is to be expressly understood that one or more elements from a claimed combination can in some cases be excised from the combination and that the claimed combination may be directed to a subcombination or variation of a subcombination.

Insubstantial changes from the claimed subject matter as viewed by a person with ordinary skill in the art, now known or later devised, are expressly contemplated as being equivalently within the scope of the claims. Therefore, obvious substitutions now or later known to one with ordinary skill in the art are defined to be within the scope of the defined elements.

The claims are thus to be understood to include what is specifically illustrated and described above, what is conceptually equivalent, what can be obviously substituted and also what essentially incorporates the essential idea of the invention.

We claim:

1. A method for electrically coupling a mesh structure to a module comprising the steps of:

electrically connecting a tail of a free air ball bond wherein the tail and free air ball bond comprise a combined free air ball bond and tail height on a conductive mesh pad in an anti-tamper mesh, defining a conductive epoxy on a conductive module pad,
aligning the free air ball bond with the conductive epoxy, and,
bonding the free air ball bond to the conductive epoxy to electrically couple the conductive mesh pad to the conductive module pad whereby a spaced-apart open volume is defined between the mesh structure and the module having a spaced-apart distance equal to the combined free air ball bond and tail height.

2. An electronic device fabricated from a method comprising the steps of:
providing an electronic device having a conductive metal pad on a surface thereof,
electrically connecting a tail of a free air ball bond, the tail and free air ball bond comprising a combined free air ball bond and tail height on a conductive mesh pad in an anti-tamper mesh,
defining a conductive epoxy on a conductive module pad,
aligning the free air ball bond with the conductive epoxy, and,
bonding the free air ball bond to the conductive epoxy to electrically couple the conductive mesh pad to the conductive module pad whereby a spaced-apart volume is defined between the mesh structure and the module having a spaced-apart distance equal to the combined free air ball bond and tail height.

3. The device of claim 2 wherein a change in electrical continuity of a trace in the anti-tamper mesh generates a predetermined tamper response.

4. The device of claim 2 wherein the predetermined tamper response is a zeroizion of the contents of a memory.

5. The device of claim 2 wherein the predetermined tamper response is an opening or closing of a FET switch.

* * * * *